United States Patent [19]

Hartman et al.

[11] 4,131,910
[45] Dec. 26, 1978

[54] HIGH VOLTAGE SEMICONDUCTOR DEVICES

[75] Inventors: Adrian R. Hartman, Westfield; James C. North, New Providence; George W. Reutlinger, Florham Park; Peter W. Shackle, Bridgewater, all of N.J.

[73] Assignee: Bell Telephone Laboratories, Incorporated, Murray Hill, N.J.

[21] Appl. No.: 849,788

[22] Filed: Nov. 9, 1977

[51] Int. Cl.² .......................................... H01L 27/12
[52] U.S. Cl. ........................................ 357/49; 357/13; 357/60; 357/55
[58] Field of Search .................... 357/49, 60, 13, 55

[56] References Cited

U.S. PATENT DOCUMENTS

| 3,411,051 | 11/1968 | Kilby | 317/239 |
|---|---|---|---|
| 3,412,295 | 11/1968 | Grebene | 317/234 |
| 3,416,224 | 12/1968 | Armstrong | 29/580 |
| 3,579,391 | 5/1971 | Buie | 148/175 |
| 3,623,219 | 11/1971 | Stoller | 29/580 |
| 3,944,447 | 3/1976 | Magdo | 148/175 |
| 3,984,859 | 10/1976 | Misawa | 357/55 |
| 3,994,011 | 11/1976 | Misawa | 357/55 |
| 4,016,007 | 4/1977 | Wada | 148/1.5 |
| 4,017,885 | 4/1977 | Kendall | 357/51 |
| 4,057,823 | 11/1977 | Burkhardt | 357/52 |

Primary Examiner—Martin H. Edlow
Attorney, Agent, or Firm—Lester H. Birnbaum

[57] ABSTRACT

Disclosed are dielectrically isolated high voltage planar devices and methods of fabricating such devices. The devices are designed so that the large electric fields at the junction edges are significantly reduced; thereby permitting a closely packed structure. This concept may be achieved by forming narrow grooves at the junctions and filling with a thermally grown oxide. In a preferred embodiment, the surface of the devices lies in the (110) plane so that the walls of the grooves are perpendicular thereto in the (111) plane. Fabrication includes bonding the semiconductor wafer to a substrate with an oxide layer therebetween and forming grooves through the wafer to the oxide layer for isolation from device to device.

11 Claims, 16 Drawing Figures

HIGH VOLTAGE SEMICONDUCTOR DEVICES

BACKGROUND OF THE INVENTION

This invention relates to high voltage semiconductor devices and methods of fabrication.

A need presently exists for integrated arrays of high voltage devices such as in telephone crosspoint switching. Because of the high bias applied to such devices, which can range from 60–600 volts, design and fabrication presents special problems. Such high voltage devices in general require large distances between regions in order to keep the high electric fields generated during operation below the breakdown level, and therefore tend to be too expensive for widespread use. It is therefore desirable to produce devices which are more compact. In addition, certain geometries such as those found in bilateral transistors and field controlled diodes require isolation of special portions of the device in order to function at high voltages. At present, no adequate means of fabricating such devices exists.

A further problem which exists in the fabrication of arrays is obtaining dielectrically isolated wafers. Most prior art techniques utilize a thick layer of polycrystalline silicon as the substrate. Such a substrate is fragile, and in addition can cause a non-uniform wafer surface when the wafer is ground to its final thickness.

It is therefore a primary object of the invention to produce monolithic arrays of high voltage devices which are compact and uniform from device to device. It is a furthe object of the invention to provide a planar technology for fabricating such arrays in a reliable, reproducible fashion.

SUMMARY OF THE INVENTION

These and other objects are achieved in accordance with the invention. Dielectrically isolated wafers are fist formed by bonding the semiconductor wafer to a monocrystalline substrate with an oxide layer in between, forming grooves through the wafer, and filling the grooves with thermal oxide. Additional grooves are formed in the wafer and filled with oxide for reducing electric fields produced at the junctions during device operation. In a preferred embodiment, very narrow grooves can be formed when the wafer surface lies in the (110) plane so that the walls of the groove are in the (111) plane. Planar batch processing can be utilized to form the various components of the devices.

BRIEF DESCRIPTION OF THE DRAWING

These and other features of the invention are delineated in detail in the following description. In the drawing.

It will be appreciated that for purposes of illustration, these figures are not drawn to scale.

DETAILED DESCRIPTION

The basic principles of the invention are described with reference to the sequence of steps illustrated in FIGS. 1–13 which demonstrate the fabrication of an array of high voltage transistors. As an example, parameters are given for the fabrication of a transistor operable at 500 volts unless otherwise stated. In the context of this application, a high voltage device is considered to be any device which is operated at 60 volts or above.

Figure 1:
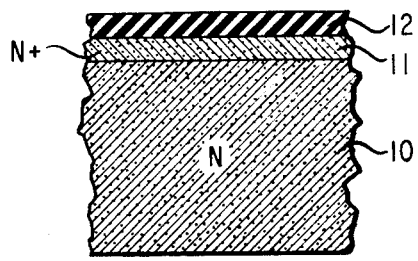
FIGS. 1–8 are cross-sectional views showing various stages of fabrication of a portion of an array of high voltage transistors in accordance with one embodiment of the invention.

Fabrication begins with a monocrystalline silicon semiconductor wafer, a portion of which is illustrated as 10 in FIG. 1. The wafer typically has a thickness in the range 15–20 mils. Illustratively, the semiconductor is N type, but it will be realized that all polarities described herein could be reversed. Typically, the wafer is doped with phosphorous to given an impurity concentration of approximately $5 \times 10^{13} - 1 \times 10^{15}$ per cm$^3$. Preferably, the major surfaces of the wafer lie in the (110) crystallographic plane for reasons which are discussed later. An N+ region, 11, is formed into the surface of the wafer to a depth of approximately 0.5–2$\mu$ by standard techniques such as diffusion or ion implantation. Illustratively, the dopant impurity is As or P and the surface concentration is approximately $1-4 \times 10^{19}$ per cm$^3$. Subsequent to formation of this region, an oxide layer 12 is formed over the surface. The oxide is preferably formed by thermal oxidation whereby the wafer is heated to 1100–1250° C. for 1–40 hrs in a wet oxygen ambient to grow an oxide with a thickness in the range 1–4$\mu$.

Figure 2:
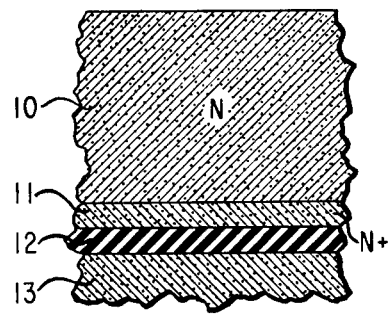

A second monocrystalline semiconductor wafer, a portion of which is shown as 13 in FIG. 2, is also provided. This wafer, which will comprise the substrate of the array, also typically has a major surface in the (110) plane and typically has a thickness of approximately 15–20 mils. The surface of this wafer may also be covered by a thermally grown oxide. The two wafers are bonded together by pressing the surfaces together with the oxide therebetween and heating. Surprisingly the thermal oxide 12 acts as a strong glue layer between the wafers. Preferably, the wafers are pressed together with a pressure of approximately 40 lbs. psi while heating at a temperature of approximately 1150 C. for about 1 hours. Alternatively, the surfaces may be coated with phosphorous-doped SiO$_2$ followed by hot pressing together. Further, the more conventional method of depositing a polycrystalline silicon handle to the monocrystalline silicon wafer may be employed.

The wafer 10 is then lapped or etched to the desired thickness. For this particular device, a final thickness of 40–55$\mu$ is desired. For a device operable at 60 volts, a thickness of 15–20$\mu$ is desired. Thus, for devices operated in a vertical direction, thicknesses will range generally from 15–60$\mu$.

Figure 3:
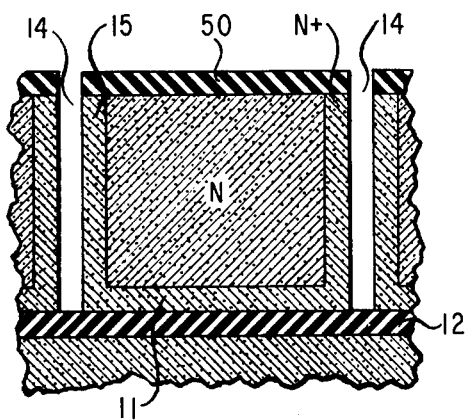

Next, as shown in FIG. 3, grooves 14 are etched through the wafer 10 to the oxide 12 in order to define the boundaries of individual devices. Thee grooves are also shown in the plan view of FIG. 9. The grooves may be etched by defining an oxide mask 50 by photo or electron beam lithography on the surface of the semiconductor an then applying a solution of KOH at a temperature of approximately 70° C. A temperature range of 65°–90° C. may be employed. Since the major surface of wafer 10 is preferably in the (110) plane, the side walls of the grooves are advantageously formed in the (111) plane perpendicular to the surface of the wafer. In order to achieve this orientation, it will be noted from FIG. 9 that the grooves are formed in the shape of parallelograms whose corner angles are approximately 70° and 110°. The anisotropic nature of the etching in the (111) planes results in extremely narrow grooves, which is a significant factor in achieving closely packed arrays. The grooves are made as narrow as possible to conserve space but wide enough to prevent breakdown at the semiconductor between devices. For 500 volt devices, the grooves are initially approximately 4μ wide. For lower voltage devices, narrower grooves may be tolerated. For example, in the fabrication of 60 volt devices, grooves as narrow as 2–3μ can be fabricated by photolithography and as narrow as 1μ by electron beam lithography.

Next, as also shown in FIG. 3, N+ regions, 15, are formed in the side walls of the grooves in order to allow contact to the buried N+ region, 11, at the surface. The regions, 15, may be formed, for example, by diffusion of P or As impurities from a gas phase source of POCl₃ or AsH₃ at a temperature of 1040° C. for a total time of about 20–40 minutes. These regions will be essentially identical in doping characteristics to the buried region, 11, and so are shown as single regions surrounding the area of device fabrication.

Figure 4:
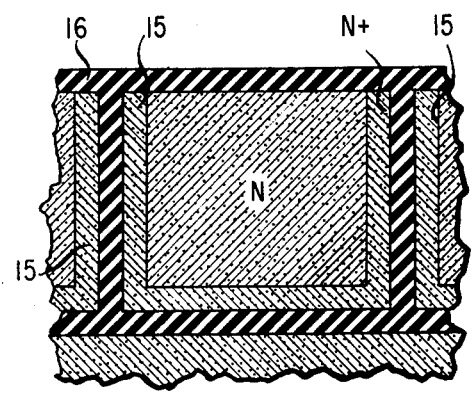
Figure 5:
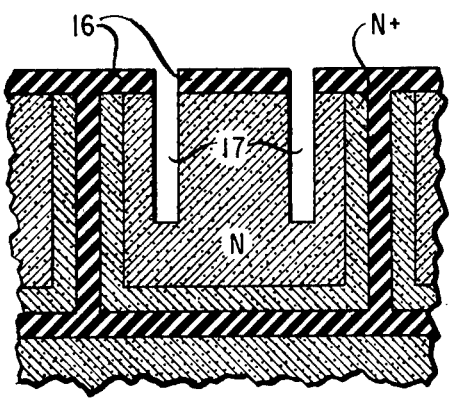

Next, as shown in FIG. 4, the grooves are filled with an insulating material, 16, in order to electrically isolate each device. It has been found that an effective means of doing this is a thermal oxidation of the walls of the grooves in a wet oxygen ambient at a temperature in the range 1100°–1250° C. With 4μ-wide grooves oxidation takes place for approximately 48 hours. Even though the grooves were narrow, it was discovered that the growing oxide would completely fill the grooves without leaving any cavities. This is significant for insuring adequate isolation. Of course, an equal amount of oxide is grown on the surface of the wafer. It will be noted that, since a portion of the side walls is consumed by the growing oxide, the final groove width will be increased. For this particular embodiment, the final width is approximately 8μ. Preferred ranges are 5–10μ for 500 volt devices and 2–10μ for high voltage devices in general.

Figure 11:
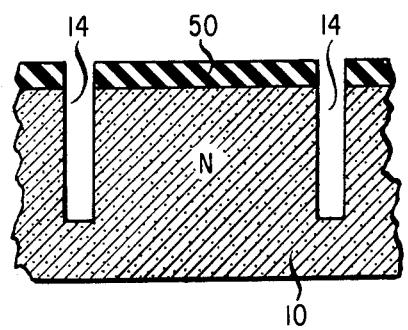
FIGS. 11–13 are cross-sectional views showing various stages of fabrication of a portion of an array of high voltage transistors in accordance with an alternative embodiment of the invention.
Figure 12:
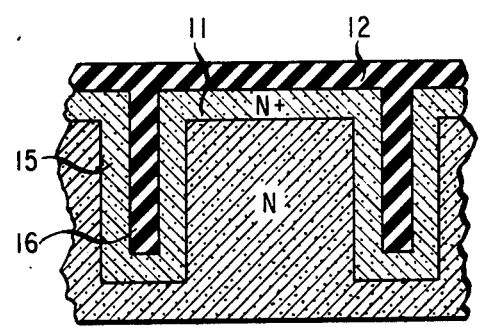
Figure 13:
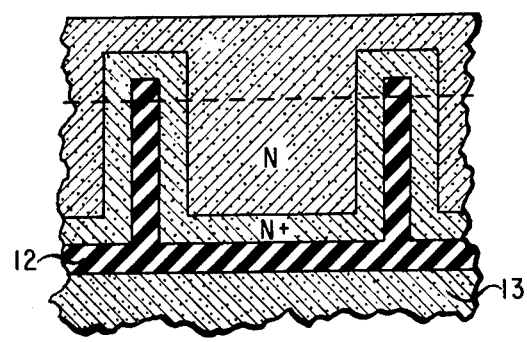

An alternative method of forming the dielectrically isolated areas may also be employed as shown in FIGS. 11–13 where elements corresponding to those in FIGS. 1–4 are similarly numbered. As shown in FIG. 11, prior to bonding the wafers together, the grooves 14 may be formed partially through the wafer 10. The oxide mask is stripped off and impurities are diffused at the surface and side walls of the groove to form the regions 11 and 15 as shown in FIG. 12. The grooves and wafer surface can then be thermally oxidized to form oxide portions 12 and 16.

The wafer and substrate are bonded together resulting in the structure of FIG. 13. The surface of the wafer, 10, opposite the substrate 13 can then be lapped or polished along the line indicated until the surface intersects the oxide filled grooves. The etched surface can then be oxidized, resulting in the same structure illustrated in FIG. 4. Again, a deposited polycrystalline layer may be used as the substrate in place of the monocrystalline silicon wafer.

Figure 10:
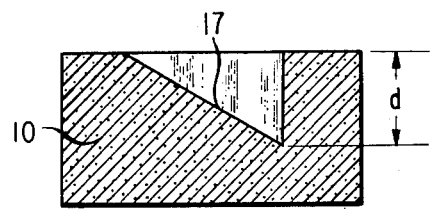
FIG. 10 is a cross-sectional view of a portion of the semiconductor wafer illustrated in FIG. 9.

In either embodiment described above, the next step, as illustrated in FIG. 5, is to form grooves 17 within the device areas. These grooves are, again, fabricated by utilizing an oxide mask defined by photo or electron lithography (from the oxide previously formed on the surface) and applying a solution of KOH at approximately 70° C. Again, since the side walls of the grooves lie in the (111) plane, they can be made extremely narrow for a closely packed structure. The same widths discussed for grooves 14 are applicable here. As shown in the plan view of FIG. 9, the grooves 17 are each made in a quadrilateral configuration parallel to grooves 14. However, due to the anisotropic etching of this crystal orientation, the etching of the grooves terminates in sets of (111) planes which lie at angles of approximately 35° with the surface of the wafer. Thus, although the sidewalls of the grooves will be perpendicular to the surface in one set of (111) planes as previously shown, the bottom of the grooves which lie in another set of (111) planes are as shown in FIG. 10, which is a cross-sectional view along line 10–10' of FIG. 9.

The depth of the grooves 17 can therefore be made self-limiting at a preselected depth, d, by providing tab portions, 19, extending beyond the quadrilateral portion diagonally opposite one another. The length L of each groove determines the depth, d, according to the relationship:

$$d \approx L/\sqrt{3}$$

since the groove bottom is at an angle of approximately 35°. Thus, the length of each tab portion may be selected to give the desired depth of the quadrilateral portion of the groove which isolates a portion of the device. Of course, the depth of the groove will not be uniform, but this will not be significant as long as the shallowest depth of the quadrilateral groove portion is deeper than the opposite conductivity regions which will be isolated in the operation of the device, as will become clearer in the geometry of the final device. In this particular embodiment, it is recommended that the minimum depth of the quadrilateral portion of grooves 17 be at least 20μ for a 500 volt device and 10μ for a 60 volt device. The maximum depth can be the full thickness of the wafer 10.

Figure 6:
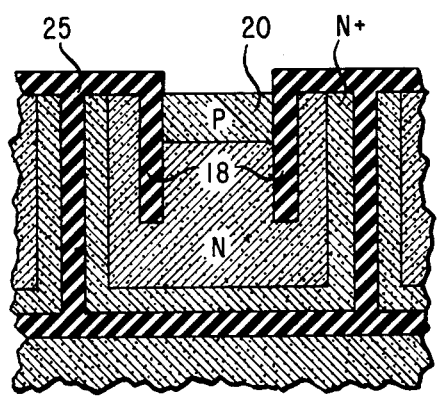

The grooves 17 are filled with a thermally grown oxide, 18 of FIG. 6, in the same way as grooves 14 were filled. The oxide-filled grooves 17 therefore electrically isolate the interior portion from the rest of the device area. This interior portion may be considered as a "planar mesa" since it provides the isolation of a mesa while permitting the simplicity of planar processing. The oxidation also results in composite oxide 25 on the surface of the wafer.

Fabrication of some standard components of high voltage transistors proceeds as shown in FIGS. 6–9. In FIG. 6, a p-type region, 20, has been diffused into the semiconductor surface bounded by grooves 17 utilizing oxide mask 25. The region 20 has its boundaries abutting the oxide-filled grooves 17 and essentially vertical boundaries are produced. This is significant since the regions of the p-n junction which normally produce the highest fields are the curved portions which have been eliminated by this geometry. The region 20 is typically formed by diffusing boron impurities to a depth of approximately 3–5µ giving an impurity surface concentration of approximately $5\times10^{17}$–$2\times10^{18}$ per cm$^3$. This region comprises the base of the transistor, with the N region of the initial wafer, 10, as the collector.

Figure 7:
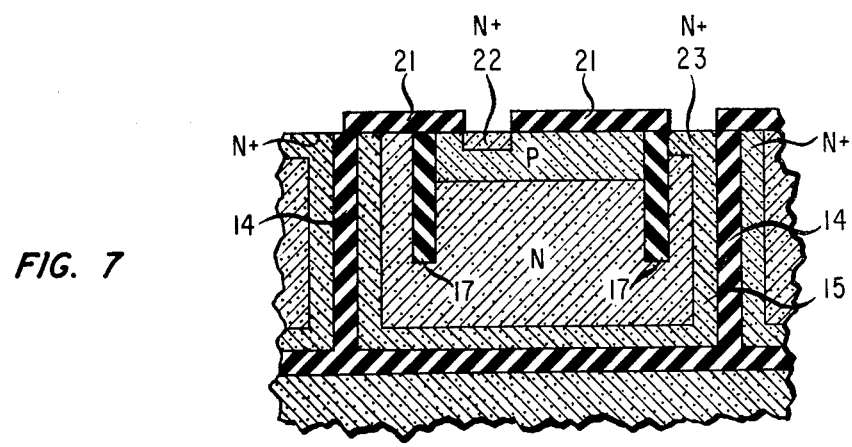
Figure 8:
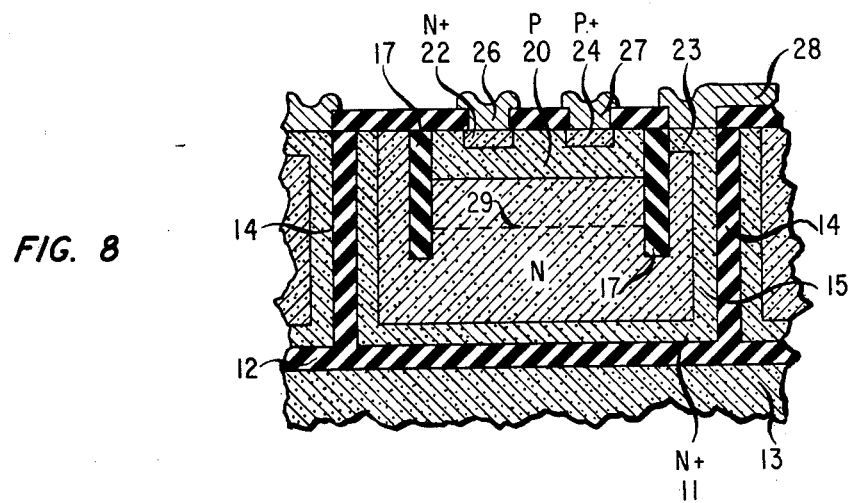
Figure 9:
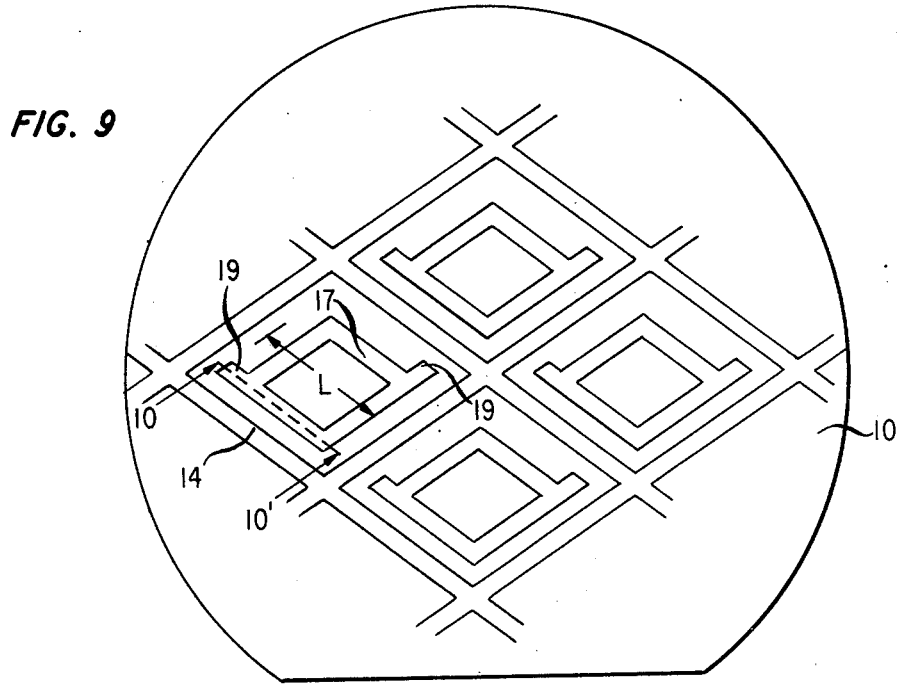
FIG. 9 is a plan view of a semiconductor wafer during one stage of fabrication in accordance with the same embodiment.

The mask may then be stripped and a new mask, 21, defined by standard photolithographic techniques as shown in FIG. 7. Regions of N+ conductivity type, 22 and 23, may then be formed by, for example, diffusion of phosphorous impurities into the exposed surface with an impurity surface concentration of approximately $5\times10^{19}$–$5\times10^{20}$ per cm$^3$. The region, 22, serves as the emitter and the region 23, as a surface contact region for the collector contact 15. It will be noted that the region 23 is bounded by grooves 17 and 14. If desired, a new mask may be formed and a p+ region, 24, as shown in FIG. 8, may be formed into the surface as a low resistance contact to the base 20. This region may be fabricated by diffusing boron impurities to produce an impurity surface concentration of approximately $3\times10^{18}$–$1\times10^{19}$ per cm$^3$. Then, with the oxide or a combined oxide and silicon nitride as an insulator, contact metal 26, 27 and 28 may be defined on the structure to contact the emitter, base and collector regions, respectively.

In addition to the features of allowing formation of diffused regions with vertical side walls as mentioned previously, the oxide-filled grooves 17 serve the function of electrically isolating one portion of the device from another so that the components can be closely spaced. In the usual high voltage device, with a bias of 500V applied, the depletion region formed around base 20 during operation would have a wide lateral extent necessitating placement of the collector contact at the surface approximately 50µ away from the base, whereas in this embodiment, they are spaced only by the width of the grooves (approximately 8µ). In the operation of this device, the depletion region produced by the base region, which is illustrated as dashed line 29 is confined to a vertical direction by the grooves. This permits a high bias to be supplied to base 20 even though the surface portion of the collector contact 23 is separated from the base only by the width of the groove. It is therefore possible to produce a high voltage transistor which can operate at a bias as high as 500V with a surface area of just $10^{-5}$ cm$^2$, whereas a similar device without these narrow grooves for isolation would require at least $10^{-4}$ cm$^2$ of surface area. Of course, the narrow grooves 14 which isolate individual devices also result in significant savings in the size of the array.

Figure 14:
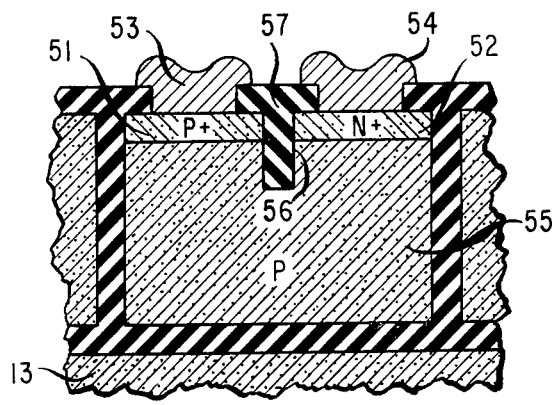
FIG. 14 is a cross-sectional view of a high voltage semiconductor device in accordance with a further embodiment of the invention.

It will be appreciated that a primary function of the grooves is to keep the electric fields generated in the device below the breakdown level (approximately $2$–$5\times10^5$ volts/cm for silicon). The grooves can therefore be used for isolation and permit close packing where lateral conduction is required between regions. A simple example is the lateral p+pn+ diode shown in FIG. 14. Dielectric isolation between devices of the array is achieved as previously described except that the wafer 55 is now of p-type conductivity. Rather than form the interior groove, 56, in an annular configuration, it is formed in a straight line into the plane of the drawing over the full length of the device. Subsequent to filling the groove with oxide 57, the anode region 51 and cathode region 52 may be sequentially formed on opposite sides of the groove and contact regions 53 and 54 formed thereon to produce a lateral device. Since the diode relies on lateral conduction, the wafer 55 can be thinner than in the previous vertical device. For a 500 volt device, a thickness of 35–45µ is preferred, while 15–20µ is still recommended for a 60 volt device. The regions 51 and 52 are typically 1–3µ deep with impurity surface concentrations of $1\times10^{19}$–$5\times10^{20}$ per cm$^3$. The groove 56 is sufficiently deep to lower the field between regions 51 and 52 below breakdown while being sufficiently shallow to permit lateral conduction under the groove. The preferred groove depth is therefore 20–25µ for a 500 volt device, and 9–11µ for a 60 volt device. The groove permits the two regions to be spaced only 8µ distant for a 500 volt device and as small as 2–3µ for a 60 volt device, as compared to 50µ and 10µ, respectively, without the groove.

It will be appreciated that several other types of high voltage devices may be fabricated in accordance with the principles of the invention. Two such devices are illustrated in FIGS. 15 and 16.

Figure 15:
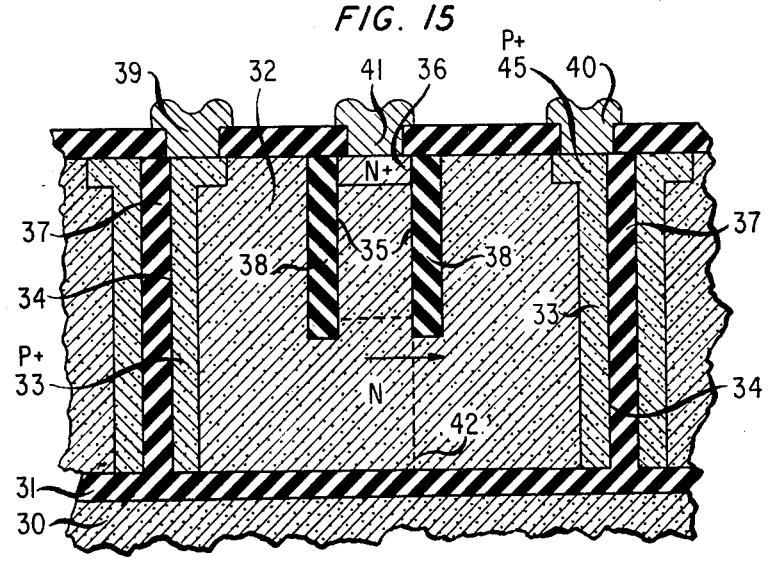
FIG. 15 is a cross-sectional view of a high voltage semiconductor device in accordance with a still further embodiment of the invention.

FIG. 15 is a cross-sectional view of a portion of an array of high voltage bilateral transistors. Dielectric isolation of the devices in the array is achieved as previously discussed. That is, the wafer 32 in which the devices are formed is bonded to a substrate wafer, 30, with an oxide glue layer 31 therebetween. Grooves 34 are etched through the wafer 32 and thermally oxidized to fill the groove with oxide 37. Prior to filling the grooves, p+ regions 33 are diffused into the sidewalls, preferably to a depth of 2–6µ with an impurity concentration of $5\times10^{18}$–$5\times10^{19}$ per cm$^2$. These regions constitute the emitter or collector in the bilateral device and are therefore only formed in the sides indicated rather than completely surrounding the device area. Grooves 35 filled with oxide 38 again are formed in a quadrilateral and define a "planar mesa" for isolation of a portion of this device. In this case, an N+ region 36 is diffused into the isolated area, typically to a depth of 1–3µ and a surface impurity concentration of $1\times10^{19}$–$1\times10^{20}$ per cm$^3$. This region constitutes a contact to the N type base region 32. Contact areas 45 are also diffused into the surface to provide larger areas of contact to the emitter/collector regions 33. An insulating pattern is formed at the surface and contacts 39 and 40 to the emitter/collector regions and contact 41 to the base region are delineated. In operation, the depletion region, 42, will spread in a horizontal direction either from the left or right across the region 32. However, the grooves 35 will halt the horizontal spread in the upper portion of the device and force the depletion region in that portion in a vertical direction (in this case upward), thereby isolating the N+ region 36 and reducing the electric field to avoid avalanche breakdown.

Figure 16:
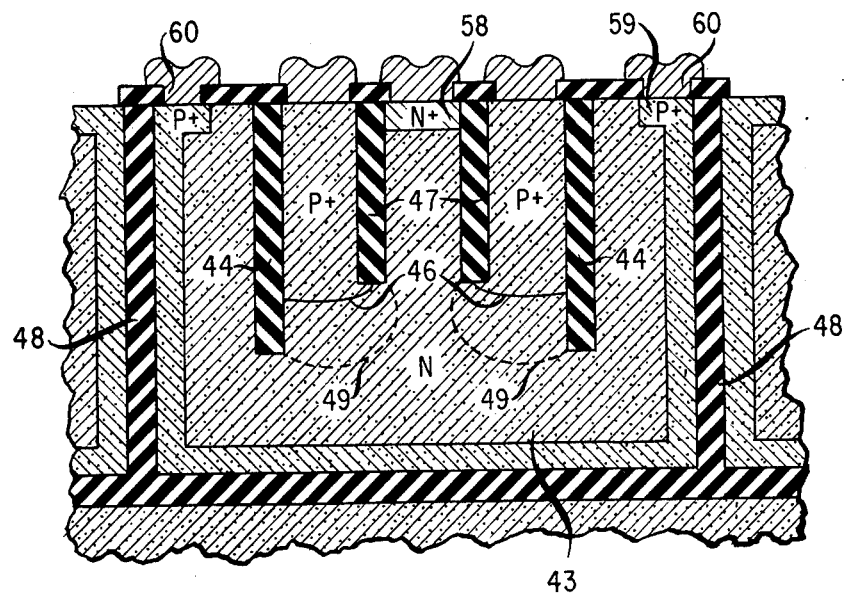
FIG. 16 is a cross-sectional view of a high voltage semiconductor device in accordance with a further embodiment of the invention.

FIG. 16 illustrates a field controlled diode fabricated in accordance with the principles of the invention. Here, two annular grooves 44 and 47 are formed in the wafer 43. P+ region 46 is diffused in the area between the inner and outer grooves to form the gate region of the device. This region is typically formed to a depth of 15–20µ with an impurity surface concentration of $5\times10^{18}$–$5\times10^{19}$ per cm$^3$. N+ region 58 is formed within the area defined by the inner groove 47 with an impurity surface concentration of approximately $1\times10^{19}$–$5\times10^{20}$ per cm$^3$ and a depth of 1–3µ. This region constitutes the cathode of the device. The anode comprises the p+ region 59 formed at the surface, at the bottom of the wafer, and along the sidewalls of the grooves 48 which separate the devices. This region typically has an impurity concentration of $5\times10^{18}$–$5\times10^{19}$ per cm$^3$. In operation, current flow is regulated from cathode to anode by the extent of depletion region 49 established by the biased gate region. The inner groove 47 isolates the cathode while the outer groove 44 isolates the anode from the depletion region. Again, the grooves permit a closer spacing of the elements of the device. It will be realized that the thickness of the wafer 43 is sufficient to sustain an adequate punch-through voltage between regions 46 and 59.

Various additional modifications will become apparent to those skilled in the art. All such variations which basically rely on the teachings through which the invention has advanced the art are considered within the spirit and scope of the invention.

What is claimed is:

1. A high voltage semiconductor device comprising a silicon substrate;
   a body of monocrystalline silicon of a first conductivity type with a pair of major surfaces lying in the (110) crystallographic plane and one major surface bonded to the substrate;
   a layer of insulating material between the body and substrate;
   a first narrow groove with sidewalls lying in the (111) plane extending completely through said body on the periphery of the device and filled with a thermally grown silicon oxide so as to electrically isolate the device from other devices formed in the body;
   a region of opposite conductivity type formed within said body so as to form a p-n junction in said body; and
   at least one interior narrow groove with sidewalls lying in the (111) plane and filled with thermally grown oxide formed in the surface of said body opposite to said substrate adjacent to a portion of the region of opposite conductivity type, said groove extending a greater distance in said body than the region so that the field between the junction and adjacent portions of the device when the junction is biased is kept below the breakdown level of the body.

2. The device according to claim 1 further comprising a buried region of the same conductivity type as the body but higher impurity concentration formed into the surface of the body bonded to the substrate and regions of the same conductivity type as the body but higher impurity concentration formed into the sidewalls of the first narrow groove at the periphery of the device and into the surface opposite to the substrate which permit electrical contact to the buried region from the opposite surface of the body.

3. The device according to claim 1 wherein a region of the same conductivity type as the body but higher impurity concentration is formed in the surface of said body opposite the substrate adjacent the interior groove and separated thereby from the region of opposite conductivity type.

4. The device according to claim 1 wherein the width of the grooves lies within the range 2–10μ.

5. The device according to claim 1 wherein the interior groove is formed in a quadrilateral configuration surrounding the region of opposite conductivity type with tab portions extending beyond the quadrilateral portion by a predetermined amount in order to establish a predetermined depth of the groove.

6. The device according to claim 3 further comprising a second region of opposite conductivity type and a second interior groove with sidewalls in the (111) plane and filled with a thermally grown silicon oxide formed in the surface of the body opposite the substrate separating the regions of opposite conductivity type, the second groove extending a greater distance into the body than the two regions.

7. The device according to claim 1 wherein the thickness of the body lies within the range 15–60μ.

8. The device according to claim 1 wherein the minimum depth of the portion of the interior groove adjacent to the region of opposite conductivity type is 9μ.

9. A high voltage semiconductor transistor comprising
   a monocrystalline silicon substrate;
   a body of monocrystalline silicon of a first conductivity type having a thickness in the range 15–60μ with a pair of major surfaces lying in the (110) crystallographic plane and one major surface bonded to the substrate;
   a layer of thermally grown silicon oxide between the body and substrate;
   an exterior groove 2–10μ wide formed in a quadrilateral configuration extending completely through said body on the periphery of the device with sidewalls lying in the (111) plane and filled with a thermally grown silicon oxide so as to electrically isolate the device from other devices formed in the body;
   a buried region of the same conductivity type as the body but higher impurity concentration formed into the surface of the body bonded to the substrate and regions of the same conductivity type as the body but higher impurity concentration formed into the sidewalls of the exterior groove and into the surface of the body opposite the substrate which permit electrical contact to the buried region from the opposite surface;
   a region of opposite conductivity type formed into the surface of the body opposite the substrate so as to form a p-n junction within the body; and
   an interior groove 2–10μ wide formed in a quadrilateral configuration in the opposite surface of the body surrounding said region of opposite conductivity and extending deeper into the body than said region, the groove having sidewalls lying in the (111) plane and filled with a thermally grown oxide such that the depletion region formed when the region is biased is confined to a vertical direction for a substantial depth in said body in order to isolate the region of opposite conductivity type from the region of the same conductivity type formed in the said surface of the body.

10. The device according to claim 9 wherein the interior groove includes a tab portion extending beyond the quadrilateral portion by a predetermined amount in order to establish a predetermined depth of the groove.

11. The device according to claim 10 wherein the minimum depth of the quadrilateral portion of the interior groove is 10μ.

* * * * *